United States Patent
Suzuki

(10) Patent No.: US 6,281,497 B1
(45) Date of Patent: Aug. 28, 2001

(54) RADIOACTIVE RAY DETECTING DEVICE

(75) Inventor: Hiroyuki Suzuki, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/351,506

(22) Filed: Jul. 12, 1999

(30) Foreign Application Priority Data

Jul. 17, 1998 (JP) .................................................. 10-203196

(51) Int. Cl.$^7$ .............................. H01L 39/08; H01L 39/02
(52) U.S. Cl. ...................................... 250/336.2; 505/848
(58) Field of Search .................. 250/336.2; 505/848, 505/849; 324/248

(56) References Cited

U.S. PATENT DOCUMENTS

| | | | |
|---|---|---|---|
| 4,970,395 | * 11/1990 | Kruse, Jr. .......................... | 250/336.2 |
| 5,028,786 | * 7/1991 | Da Silva et al. ................. | 250/336.2 |
| 5,185,527 | * 2/1993 | Bluzer .............................. | 250/336.2 |
| 5,338,934 | 8/1994 | Morohashi et al. . | |
| 5,347,143 | * 9/1994 | Schröder ............................. | 505/191 |
| 5,448,098 | * 9/1995 | Shinohara et al. ................. | 257/441 |
| 5,538,941 | * 7/1996 | Findikoglu et al. ................ | 505/210 |
| 5,710,437 | * 1/1998 | Kurkado et al. .................. | 257/32 |
| 5,880,468 | * 3/1999 | Irwin et al. ...................... | 250/332.2 |

FOREIGN PATENT DOCUMENTS

| | | | |
|---|---|---|---|
| 43 06 497 A1 | * 7/1993 | (DE) | ................. H01L/5/32 |
| 862178 | 3/1961 | (GB) . | |
| 878377 | 9/1961 | (GB) . | |
| 1076194 | 7/1967 | (GB) . | |

* cited by examiner

Primary Examiner—Constantine Hannaher
Assistant Examiner—Albert Gagliardi
(74) Attorney, Agent, or Firm—Adams & Wilks

(57) ABSTRACT

A radioactive ray detecting device comprises a superconductor element formed without an underlying substrate, an oxide film formed on a surface of the superconductor element, and a superconductor thin film formed on the oxide film. The oxide film and the superconductor thin film cover substantially an entire periphery of the surface of the superconductor element. The semiconductor element may be formed of a polycrystalline material such as aluminum, or a single crystal superconductor such as one containing tin, lead, niobium or tantalum, and may have a circular cross section or a rectangular cross section.

13 Claims, 1 Drawing Sheet

RADIOACTIVE RAY DETECTING DEVICE

BACKGROUND OF THE INVENTION

The present invention relates to a radioactive ray detecting device used as a radioactive ray detector to measure the energy spectrum of a radioactive ray including an electromagnetic wave and an electron beam, such as an X ray and γ ray, and a corpuscular ray, such as an α ray.

A conventional radioactive ray detecting device using a superconductor tunnel junction is structured by a very thin oxide film (not shown) of approximately 1 to 2 nm formed by oxidizing a surface of a conventional first superconductor thin film 8 formed on a substrate 7 as in FIG. 3, and a conventional second superconductor thin film 9 further provided thereon.

A silicon single crystal or sapphire single crystal with an oxide film is used as a material of the substrate 7. Also, a sputter film or evaporation film such as tin, lead, niobium or tantalum is used as the conventional first superconductor thin film 8. A sputter film or evaporation film such as tin, lead, niobium or tantalum is also used for the conventional second superconductor thin film 9.

The radioactive ray incident inside the conventional first superconductor thin film 8 causes quasiparticles at the inside. The quasiparticles in this case can be considered to be usually electrons, which move due to diffusion. If they move to the vicinity of the oxide film within their lifetime, they pass through the oxide film by a tunnel effect and are collected as signal charges by the conventional second superconductor thin film 9.

Because the amount of signal charges is proportional to an incident radioactive ray energy, it is possible to measure a radioactive ray energy.

In the conventional structure, the conventional superconductor thin film 8 is formed on the substrate 7. The quasiparticles caused in the first superconductor thin film 8 due to the radioactive ray pass through the oxide film by the tunnel effect and are collected as signal charges by the conventional second superconductor thin film 9. However, the loss of quasiparticles occurs at an interface of the conventional first superconductor thin film 8 and the substrate 7, reducing the signal charge collection efficiency.

Also, although part of the energy of the radioactive ray causes phonon in the conventional first superconductor thin film 8, a phonon possessing a sufficient energy further causes quasiparticles thus contributing to signal charges. This phonon also causes a loss at the interface, if the substrate 7 is present.

Furthermore, because the conventional first superconductor thin film 8 formed on the substrate 7 is polycrystalline, the quasiparticles causes a loss at grain boundaries, reducing the signal charge collection efficiency.

If the charge collection efficiency is low, the variation in the statistically measured charge amount increases so that the energy measurement value is increased in variation thus worsening energy resolving power.

SUMMARY OF THE INVENTION

A radioactive ray detecting device of the present invention was structured in that: an oxide film is formed on a side surface of a columnar superconductor, a superconductor thin film is provided thereon, and the oxide film and the superconductor thin film cover the entire periphery of a side surface of the columnar superconductor, or otherwise by forming a first superconductor thin film on a side surface of a columnar superconductor, oxidizing a superconductor thin film surface to form an oxide film, thereafter providing a second superconductor thin film, and the first superconductor thin film and the oxide film and the second superconductor thin film cover the entire periphery of a side surface of the columnar superconductor.

Further, a radioactive ray detecting device is characterized in that the columnar superconductor is a single crystal body.

With such structures, it is possible to eliminate the loss at an interface with the substrate, of quasiparticles or phonon caused within the columnar superconductor by a radioactive ray.

Moreover, a single crystal body used as the columnar superconductor reduces the probability that quasiparticles cause a loss at grain boundaries inside the superconductor.

DESCRIPTION OF THE DRAWINGS

FIGS. 1A–1B are sectional views of a first embodiment of the present invention, wherein FIG. 1A is a sectional view in an axial direction and FIG. 1B is a sectional view taken along a line A–A'.

FIGS. 2A–2B are sectional views of a second embodiment of sent invention, wherein FIG. 2A is a sectional view in an axial direction and FIG. 2B is a sectional view taken along a line B–B'.

Figure 1A:
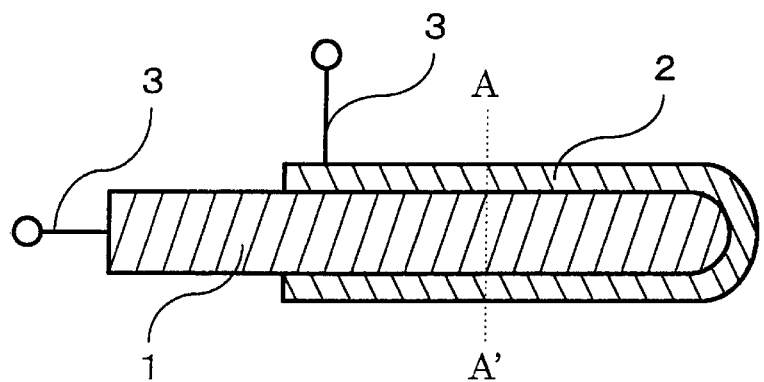

Description of the Reference Numerals and Signs is as follows:

1 circular columnar superconductor
2 superconductor thin film
3 lead wire
4 rectangular columnar superconductor
5 first superconductor thin film
6 second superconductor thin film
7 substrate
8 conventional first superconductor thin film
9 conventional second superconductor thin film

DESCRIPTION OF THE INVENTION

Embodiment 1

Figure 1B:
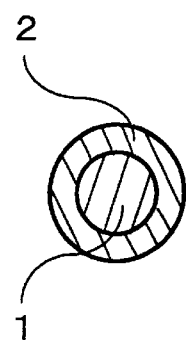

FIGS. 1A–1B show structural views of a first embodiment according to the present invention.

A circular column superconductor 1 is formed of polycrystalline aluminum in a circular columnar form having a of 100 μm and a length of 5 mm. Aluminum is a superconductor at temperatures of below about 1K, which is a material available in high purity and characterized long in quasiparticle life.

By placing a surface of the circular columnar superconductor 1 in an oxygen atmosphere, a not-shown oxide film is formed over an entire surface of the circular column superconductor 1. Then, an aluminum thin film was evaporated as a superrcondutive thin film 2 in a thickness of 0.2 μm on the oxide film of the circular column superconductor 1 over an entire periphery thereof. In this embodiment, the length of an evaporation region with aluminum is 500 μm in length including a tip. The aluminum thin film can be formed by sputtering. If the aluminum thin film is formed by sputtering, an aluminum film is formed also at the tip portion of the circular columnar superconductor 1.

At this time, even where the aluminum thin film is not necessarily evaporated completely over the entire periphery, the charge collection efficiency can be sufficiently obtained if an un-deposited area is comparatively small.

A radioactive ray is emitted incident to a side surface close to a lengthwise central portion of the aluminum thin film evaporation region. Quasiparticles occurring inside the circular columnar superconductor 1 are collected due to a tunnel effect by the aluminum thin film as the superconductor thin film 2. The collected charges are extracted through a lead wire 3.

Although the present embodiment used polycrystalline aluminum as the circular columnar superconductor 1, a polycrystalline superconductor or single crystal superconductor of tin, lead, niobium or tantalum may be used, thus not limited to polycrystalline aluminum.

Embodiment 2

Figure 2A:
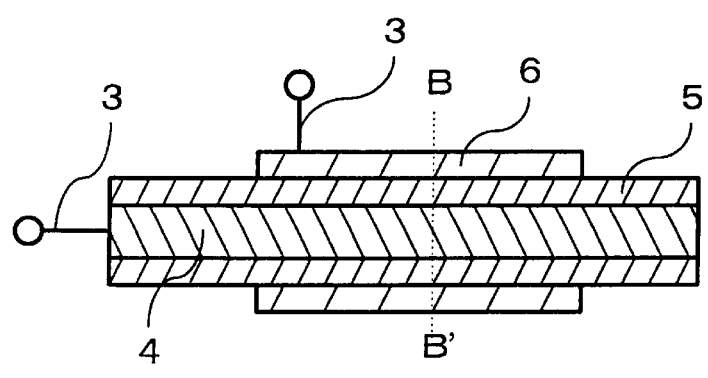
Figure 2B:
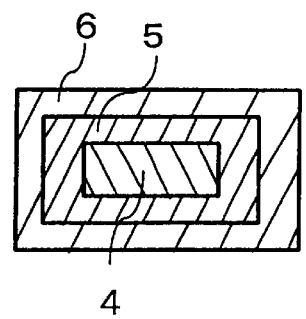
Figure 3:
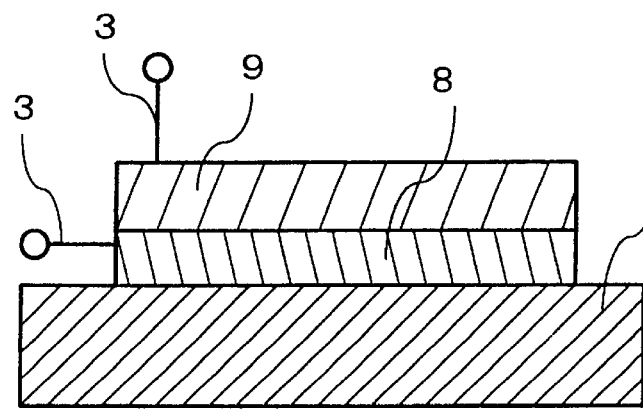
FIG. 3 is a sectional view of a radioactive ray detecting according to the prior art.

FIGS. 2A–2B show structural views of a second embodiment according to the present invention.

A rectangular column superconductor 4 formed of single crystal tantalum having a thickness of 25 $\mu$m, a width of 500 $\mu$m and a length of 5 mm is heated in a ultra-high vacuum up to 2300° C. to remove of impurities and a surface oxide film. An aluminum thin film with a thickness of 0.2 $\mu$m is evaporated as a first superconductor thin film 5 on a periphery over an entire length, and thereafter oxidized in an oxygen atmosphere to form a not-shown aluminum oxide film. Further, an aluminum thin film with a thickness of 0.2 $\mu$m is evaporated as a second superconductor film 6 on an entire periphery in a 500-$\mu$m length region.

Because by making the first superconductor thin film 5 with aluminum an aluminum oxide film can be utilized which is smaller in leak current than a tantalum oxide film formed by oxidizing a surface of single-crystal tantalum, noise due to leak current can be decreased. On the other hand, aluminum has the disadvantage that it is small in radioactive ray absorption coefficient. By using tantalum, which has a large radioactive ray absorption coefficient, for the rectangular column superconductor 4 and making the first superconductor thin film 5 with aluminum, it is possible to obtain a radioactive ray detecting device which is large in detector radioactive ray absorption coefficient and small in leak current.

Although in the present embodiment the rectangular columnar superconductor 4 was formed of single crystal tantalum, a single crystal superconductor or polycrystalline superconductor such as tin, lead, niobium or tantalum may be used without being limited to single crystal niobium. Also, although the second superconductor thin film 6 used aluminum, a superconductor such as tin, lead, niobium or tantalum may be used without limited to aluminum.

According to the present invention, an oxide film is formed on a side surface of a columnar superconductor, a superconductor thin film is provided thereon, and the oxide film and the superconductor thin film cover the entire periphery of a surface of the columnar superconductor. Due to this, the quasiparticles occuring within the columnar superconductor by a radioactive ray will not undergo a loss at an interface with a substrate. Accordingly, the signal charge collection efficiency increases, and the statistic variation in the signal charges decreases, improving energy resolving power.

Also, a first superconductor thin film is formed on a side surface of a columnar superconductor, a superconductor thin film surface is oxidized to form an oxide film, thereafter providing a second superconductor thin film, and the first superconductor thin film, the oxide film and the second superconductor thin film cover the entire periphery of a side surface the columnar superconductor. Due to this, it is possible to use as the columnar superconductor a superconductor large in radioactive ray absorption efficiency, and form as the first superconductor thin film an oxide film small in leak current, thereby reducing noise due to leak current. Thus, it is possible to obtain a detecting device that is high in energy resolving power and large in radioactive ray absorption coefficient.

Furthermore, the use of a single crystal body as the columnar superconductor can reduce the probability that the quasiparticles undergo a loss at grain boundaries within the superconductor.

What is claimed is:

1. A radioactive ray detecting device comprising: a columnar superconductor; an oxide film formed on a surface of the columnar superconductor; and a superconductor thin film provided on the oxide film; wherein the oxide film and the superconductor thin film cover substantially an entire periphery of this surface of the columnar superconductor.

2. A radioactive ray detecting device as recited in claim 1; wherein the columnar superconductor has a single crystal structure.

3. A radioactive ray detecting device fabricating process comprising the steps of: forming a first superconductor thin film on a side surface of a columnar superconductors oxidizing the first superconductor thin film to form an oxide film; and thereafter providing a second superconductor thin film; wherein the first superconductor thin film and the oxide film and the second superconductor thin film cover substantially an entire periphery of a surface of the columnar superconductor.

4. A radioactive ray detecting device fabricating process as recited in claim 3; wherein the columnar superconductor has a single crystal structure.

5. A radioactive ray detecting device comprising: a superconductor element formed without an underlying substrate; an oxide film formed on a surface of the superconductor element; and a superconductor thin film formed on the oxide film; wherein the oxide film and the superconductor thin film cover substantially an entire periphery of the surface of the superconductor element.

6. A radioactive ray detecting device according to claim 5; wherein the superconductor element has a single crystal structure.

7. A radioactive ray detecting device according to claim 5; wherein the superconductor element is formed of polycrystalline aluminum.

8. A radioactive ray detecting device according to claim 5; wherein the superconductor element has a circular cross section.

9. A radioactive ray detecting device according to claim 8; wherein the superconductor element has a diameter of 100 $\mu$m and a length of 5 mm.

10. A radioactive ray detecting device according to claim 5; wherein the superconductor thin film is formed of aluminum and has a thickness of 0.2 $\mu$m.

11. A radioactive ray detecting device according to claim 5; wherein the superconductor element is formed of one of a polycrystalline superconductor and a single crystal superconductor selected from the group containing tin, lead, niobium and tantalum.

12. A radioactive ray detecting device according to claim 5; wherein the superconductor element has a rectangular cross section.

13. A radioactive ray detecting device according to claim 12; wherein the superconductor element has a thickness of 25 $\mu$m, a width of 500 $\mu$m and a length of 5 mm.

\* \* \* \* \*